(12) United States Patent
Chen et al.

(10) Patent No.: US 8,638,101 B2
(45) Date of Patent: Jan. 28, 2014

(54) METHOD AND APPARATUS FOR COMPENSATING INSUFFICIENT HOMOGENEITY OF THE BASIC MAGNETIC FIELD IN A MAGNETIC RESONANCE APPARATUS

(75) Inventors: Jin Jun Chen, Shenzhen (CN); Cheng Ni, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 593 days.

(21) Appl. No.: 12/861,871

(22) Filed: Aug. 24, 2010

(65) Prior Publication Data

US 2011/0050229 A1 Mar. 3, 2011

(30) Foreign Application Priority Data

Aug. 31, 2009 (CN) .......................... 2009 1 0169695

(51) Int. Cl.
*G01R 33/44* (2006.01)
(52) U.S. Cl.
USPC ........... 324/320; 324/307; 324/309; 324/319; 335/299; 335/302
(58) Field of Classification Search
USPC .......................... 324/318, 320; 335/299–302; 600/407–410
See application file for complete search history.

(56) References Cited

U.S. PATENT DOCUMENTS

| | | | |
|---|---|---|---|
| 6,291,998 B1 | 9/2001 | Heid | |
| 7,218,113 B2* | 5/2007 | Feiweier et al. | 324/320 |
| 7,535,231 B2* | 5/2009 | Dewdney et al. | 324/320 |
| 2007/0114997 A1* | 5/2007 | Hollis | 324/318 |

OTHER PUBLICATIONS

Jezzard, Peter; Shim Coil Design, Limitations and Implications; May 9, 2006; Internation Society for Magnetic Resonance in Medicine; 2006 Annual Meeting; pp. 1-2.*
ISMRM; Table of Contents—International Society for Magnetic Resonance in Medicine; 2006; 2006 Annual Meeting; p. 2.*

* cited by examiner

*Primary Examiner* — Melissa Koval
*Assistant Examiner* — Rishi Patel
(74) *Attorney, Agent, or Firm* — Schiff Hardin LLP

(57) ABSTRACT

In a method and device for compensating the insufficient homogeneity of a magnetic field in a magnetic resonance system, the spatial position and size of a basic magnetic field region and at least one additional magnetic field region in a field to be homogenized and determined. An optimization calculation is implemented on the basic magnetic field region and the at least one additional magnetic field region. A homogenized magnetic field at the main magnetic field region and the at least one additional magnetic field region is output according to the result of the optimization calculation.

17 Claims, 2 Drawing Sheets

METHOD AND APPARATUS FOR COMPENSATING INSUFFICIENT HOMOGENEITY OF THE BASIC MAGNETIC FIELD IN A MAGNETIC RESONANCE APPARATUS

BACKGROUND OF THE INVENTION

1. Field of the Invention

The present invention relates to technology for shimming during magnetic resonance imaging (MRI) and, particularly, to a method and an apparatus for compensating an insufficient homogeneity of an MRI basic magnetic field using shimming technology.

2. Description of the Prior Art

For a medical MRI system, it is necessary to place a patient in a homogeneous magnetic field, so as to orient the proton magnetic moments of water molecules in the body along a single direction, then the imaging region is irradiated with radio frequency signals that are absorbable by the protons. A greyscale image of the tissue within the region is acquired by applying a radio frequency sequence and a gradient sequence, receiving the resulting resonance signals, and carrying out signal processing. According to the conditions of magnetic resonance, the basic magnetic field of the imaging magnet needs to exhibit a relatively high homogeneity. The more homogeneous the basic magnetic field, the higher the signal-to-noise ratio (SNR).

With the increasing enhancement of MRI field intensity, the requirement on the SNR also increases, therefore shimming technology becomes more and more important. During practical production, the magnetic field of a magnet cannot reach the uniformity level required for MRI imaging, and for this reason, it is necessary to carry out shimming after the magnet has been assembled. An MRI magnet for common medical whole-body imaging needs to form a uniform net magnetic field within a DSV (diameter spherical volume) of 30-40 centimeters from the center of the magnetic field.

Although a homogenized magnetic field will be formed within the spherical volume at the center of the magnetic field and the homogenized magnetic field can cover most parts of a body, it is still possible for some body parts, such as the shoulders, to be exposed outside the homogeneous magnetic field, so the imaging quality of such body parts exposed outside the homogenized magnetic field will be significantly affected.

To address this problem, solutions currently available include mainly the following:

(1) Design a magnet that is capable of forming quite a large homogenized magnetic field, for example, a homogenized magnetic field up to a spherical volume of 50 centimeters in diameter, so as to cover the body parts such as shoulders; however, this method is very expensive.

(2) Make a rational arrangement of the patient inside the magnet, so as to position the body parts concerned for diagnosis, such as shoulders, within the region of the homogenized magnetic field. The condition upon which this method is based is that there is enough space in the magnet gap, making it possible to form the images of the patient's body parts, such as shoulders.

(3) Adopt a local shimming method so as to obtain a locally homogenized magnetic field at the body parts, such as shoulders, and such a technology is disclosed in the DE29805903, corresponding to U.S. Pat. No. 6,291,998. This method has some drawbacks: firstly, the locally arranged homogeneous field will produce magnetic force; secondly, the locally arranged homogeneous field needs a certain space and location accuracy; and thirdly, shimming by metal will produce eddy currents, thus affecting imaging quality.

SUMMARY OF THE INVENTION

The present invention provides a method for compensating the insufficient homogeneity of a magnetic field, which is capable of expanding the region of a homogenized magnetic field locally, and has the features of being easy to implement, economical, there being no need to modify an existing magnet.

The present invention also provides an apparatus for compensating the insufficient homogeneity of magnetic field locally, which is capable of expanding the region of a homogenized magnetic field, and has the features of being easy to implement, economical, there being no need to modify existing magnet.

The method according to the present invention for compensating the insufficient homogeneity of a magnetic field, includes, in a computerized processor, determining the spatial position and size of a main magnetic field region and at least one additional magnetic field region in a field to be homogenized, carrying out an optimization calculation on the main magnetic field region and the at least one additional magnetic field region, and outputting a homogenized magnetic field at the main magnetic field region and the at least one additional magnetic field region according to the result of said optimization calculation.

Carrying out an optimization calculation on the main magnetic field region and the at least one additional magnetic field region can include calculating the optimized shimming current distribution or the optimized shim distribution for forming the homogenized field in the main magnetic field and the at least one additional magnetic field.

In this case, calculating the optimized shimming current distribution or the optimized shim distribution for forming the homogenized field in the main magnetic field region and the at least one additional magnetic field region can include solving respectively the Laplace's equations $\nabla^2 B=0$ for the magnetic field region and the at least one additional magnetic field region, wherein B is the magnetic induction intensity of the homogeneous field expected to be formed in said main magnetic field region and said at least one additional region, and making all the harmonics obtained by said solving the Laplace's equations approach zero, so as to obtain the optimized shimming current distribution or the optimized shim distribution.

Outputting a homogenized magnetic field at the main magnetic field region and the at least one additional magnetic field region according to the result of said optimization calculation includes applying corresponding currents to shimming coils of different orders according to the calculated optimized shimming current distribution, or deploying a number of shims in a shim holder according to the calculated optimized shim distribution.

In this case, all the regions in said main magnetic field region and said at least one additional magnetic field region are spatially independent of one another, or one or more of the regions are partially overlapped with other regions.

The present invention also provides an apparatus for compensating the insufficient homogeneity of a magnetic field, that includes a magnetic field region determining unit for determining the spatial position and size of a main magnetic field region and at least one additional magnetic field region in a field to be homogenized, and a magnetic field optimization unit for carrying out an optimization calculation on the magnetic field of the main magnetic field region and the at least one additional magnetic field region, and a magnetic field outputting unit for outputting a homogenized magnetic field at the main magnetic field region and the at least one additional magnetic field region according to the result of the optimization calculation.

Preferably, the magnetic field optimization unit calculates the optimized shimming current distribution or the optimized shim distribution, for forming the homogenized field in the main magnetic field and the at least one additional magnetic field.

Preferably, the magnetic field outputting unit includes all or any one of a shimming current control unit and a shim control unit, wherein the shimming current control unit is used for applying corresponding currents to shimming coils of different orders according to the optimized shimming current distribution and the shim control unit is used for deploying a number of shims in a shim holder according to the optimized shim distribution.

It can be seen from the above technical solutions that the present invention carries out an optimization calculation on the main magnetic field region and additional magnetic field regions in the field to be homogenized, and forms a homogenized magnetic field in the main magnetic field and the additional magnetic field region, thus expanding the homogenized magnetic field locally rather than expanding a homogenized magnetic field in all directions. Since there is no need to expand a homogenized magnetic field in all directions, the present invention is easy to implement and more economical. The present invention does not need to modify the structure of the existing magnets or to introduce any additional component, thus giving the design of the magnet a greater degree of freedom. The present invention does not need to modify a local coil to deploy a locally homogeneous field, and does not need to introduce any additional physical structure to maintain the locally homogeneous field either.

DESCRIPTION OF THE PREFERRED EMBODIMENTS

In order to make the technical solutions and advantages of the present invention more apparent, the present invention will be further described in detail in conjunction with the accompanying drawings and embodiments. It should be understood that the embodiments described herein are merely for explaining the present invention, and they are not to limit the present invention.

Figure 1:
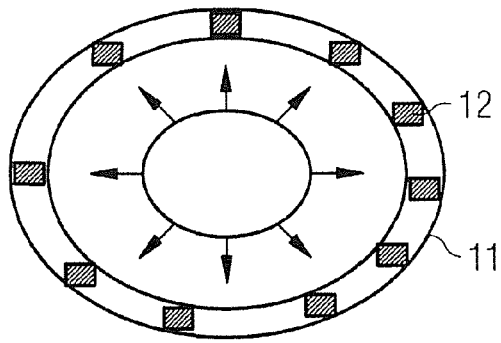
FIG. 1 is a schematic diagram of expanding the volume of a homogeneous magnetic field by an existing shimming technique.

FIG. 1 is a schematic diagram of expanding the volume of a magnetic field by existing techniques. In FIG. 1, a shim tray 11 contains a number of shims 12, at the center of which is a homogeneous magnetic field of a spherical volume. It can be seen in FIG. 1 that, when seeking solutions for the problems in the prior art, the existing techniques are all based on expanding the volume of a homogeneous magnetic field in all directions. The object that is desired to be achieved is to form a homogenized magnetic field in a bigger spherical volume, so as to satisfy the requirements for imaging body parts such as the shoulders.

Figure 2:
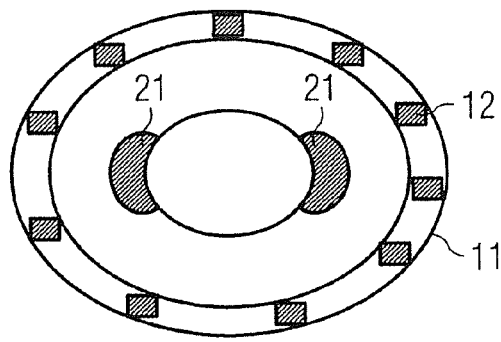
FIG. 2 is a schematic diagram of expanding the volume of a homogeneous magnetic field by the shimming technique of the present invention.

FIG. 2 is a schematic diagram of expanding the volume of a homogeneous magnetic field by the shimming technique of the present invention. When faced with the problems in the prior art, the inventors of the present invention have taken into consideration some defects and problems in the currently available solutions, and propose an inventive concept of locally expanding the volume of a homogeneous magnetic field rather than expanding the volume of the homogeneous magnetic field in all directions. As shown in FIG. 2, according to an embodiment of the present invention, two additional magnetic field regions 21 are formed in two regions outside the spherical volume of the original homogeneous magnetic field, and a homogenized magnetic field is formed in these two additional magnetic field regions and the original magnetic field region for covering the body parts such as shoulders, so as to meet the imaging requirements.

Figure 3:
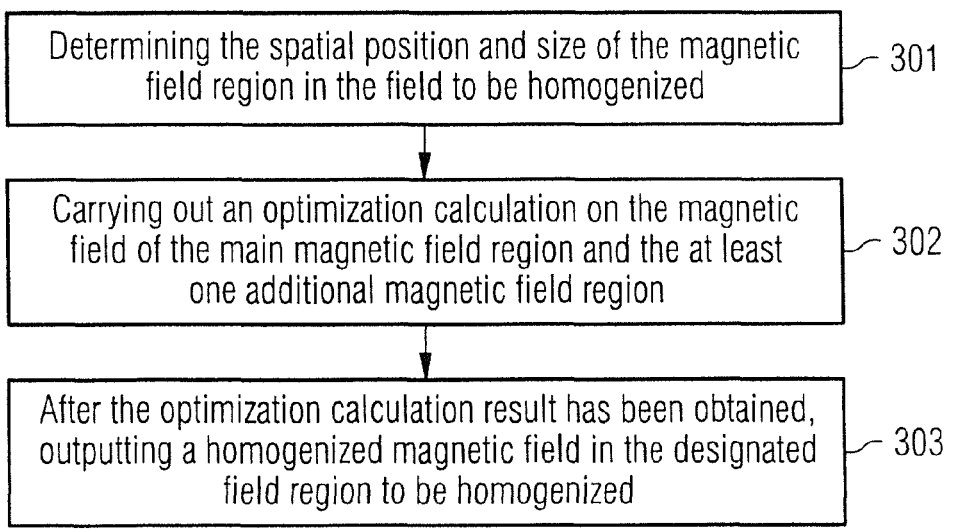
FIG. 3 is a flowchart showing the method for compensating the insufficient homogeneity of a magnetic field according to an embodiment of the present invention.

In a particular embodiment, as shown in FIG. 3, the following steps can be taken to implement the aforementioned concept of the present invention:

Step 301, determining the spatial position and size of the magnetic field region in the field to be homogenized, wherein the magnetic field region in the field to be homogenized generally comprises the original main magnetic field region and at least one additional magnetic field region. In this embodiment there are two additional magnetic field regions. A homogenized magnetic field needs to form within the main magnetic field region and these two additional regions. Here, the main magnetic field region and the additional magnetic field regions are generally spherical volumes, thus, preferably, the size of the various magnetic field regions is represented by the sphere's radius.

Step 302, carrying out an optimization calculation on the magnetic field of the main magnetic field region and the at least one additional magnetic field region.

Before introducing the particular optimization algorithm, it is necessary to introduce two shimming methods that can be utilized in the present invention. The present invention can use both active shimming (by installing shimming coils) and passive shimming.

Active shimming is carrying out shimming by shimming coils and calculating what magnitudes of current should be applied to shimming coils of different orders so as to make the magnetic field satisfy a certain homogeneity requirement in a designated region.

Passive shimming is carrying out shimming by using the currently available shims. The distribution of the shims in a shim holder is optimized, enabling the magnetic field generated by the shims to offset as much as possible the magnetic field in designated regions, so as to homogenize the same.

No matter whether active shimming or passive shimming is used, an optimization calculation is carried out on the magnetic field in the designated region. A particular optimization algorithm is introduced as follows.

In the region of a homogeneous field, the magnetic induction intensity B satisfies Laplace's equation:

$$\nabla^2 B = 0$$

In different magnetic field regions, the solutions of the above differential equation are respectively:

in the main magnetic field region:

$$B(r_1, \theta_1, \phi_1) = \sum_{n=0}^{\infty} \sum_{m=0}^{n} \{r_1^n P_n^m(\cos\theta_1)[A_n^m \cos m\phi_1 + B_n^m \sin m\phi_1]\};$$

in a first additional magnetic field region:

$$B1(r_2, \theta_2, \phi_2) = \sum_{n=0}^{\infty} \sum_{m=0}^{n} \{r_2^n P_n^m(\cos\theta_2)[LA_n^m \cos m\phi_2 + LB_n^m \sin m\phi_2]\};$$

in a second additional magnetic field region:

$$Br(r_3, \theta_3, \phi_3) = \sum_{n=0}^{\infty} \sum_{m=0}^{n} \{r_3^n P_n^m(\cos\theta_3)[RA_n^m \cos m\phi_3 + B_n^m \sin m\phi_3]\}.$$

Figure 4:
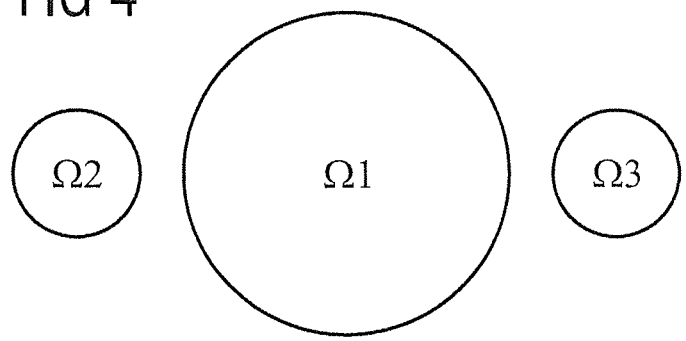
FIG. 4 shows three magnetic field regions to be homogenized.
Figure 4:
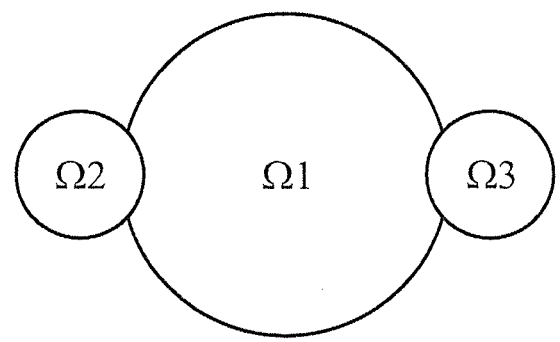

FIG. 4 shows the magnetic field regions of three fields to be homogenized, in which Ω1 represents the main magnetic field region; Ω2 represents the first additional magnetic field region, and Ω3 represents the second additional magnetic field region. In this case, r1, r2, r3, Pn, An, Bn, LAn, LBn, RAn, RBn are coefficients. FIG. 4 only shows two examples, in the first example, the basic magnetic field region and the first and second additional magnetic field regions are independent of one another without overlapping; and in the second example, the main magnetic field region is partially overlapped respectively with the first and the second additional magnetic field regions. It is understood by those skilled in the art that, the present invention is not limited to these two examples, there can be other relative positional relationships among these three regions, and on the basis of the actual imaging, adjustments can be made.

In order to obtain a homogenized magnetic field, all harmonics approach zero in ideal situations. During the numerical calculation, the maximum value for n assumes N, which satisfies the expected accuracy. The shimming algorithm is as follows:

$$\text{Minimize} \left\{ \sum_{n=0}^{N} \sum_{m=0}^{n} [(A_n^m)^2 + (B_n^m)^2 + (LA_n^m) + (LB_n^m)^2 + (RA_n^m) + (RB_n^m)^2] \right\}.$$

In this case, all harmonics are associated with the shimming current-harmonic sensitivity or shim-harmonic sensitivity. For the active shimming, all harmonics are associated with the shimming current-harmonic sensitivity, and the shimming algorithm will provide the optimized shimming current distribution. For the passive shimming, all harmonics are associated with the shim-harmonic sensitivity, and the shimming algorithm will provide the optimized shim distribution.

Step 303, in this embodiment, after the optimization calculation result has been obtained and after the optimized shimming current or optimized shim distribution has been obtained, an ideal homogenized magnetic field can be outputted in the designated field to be homogenized.

If active shimming is used, applying corresponding currents to the shimming coils of different orders according to the calculated optimized shimming current distribution, thus forming a homogenized magnetic field in the main magnetic field region and these two additional magnetic field regions.

If passive shimming is used, deploying a plurality of shims in the shim holder according to the calculated optimized shim distribution, thus enabling the magnetic field generated by the shims to compensate as much as possible the magnetic field of designated regions to homogenize it.

Figure 5:
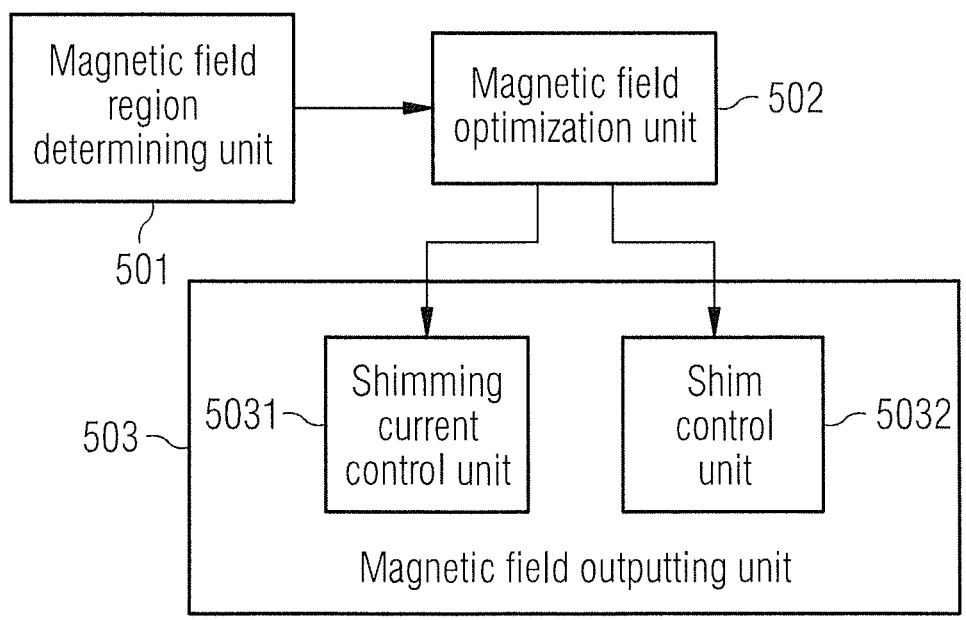
FIG. 5 is the structural diagram of an apparatus for compensating the insufficient homogeneity of a magnetic field according to an embodiment of the present invention.

The present invention also provides an apparatus for implanting the above method. FIG. 5 shows the structural diagram of the apparatus for compensating the insufficient homogeneity of the magnetic field according to the embodiment of the present invention. As shown in FIG. 4, the apparatus comprises a magnetic field region determining unit 501, a magnetic field optimization unit 502 and a magnetic field outputting unit 503. The magnetic field region determining unit 501 determines the spatial position and size of a main magnetic field region and at least one additional magnetic field region in the field to be homogenized. The magnetic field optimization unit 502 carries out an optimization calculation on the magnetic field of the main magnetic field region and the at least one additional magnetic field region; and the magnetic field outputting unit 503 outputs a homogenized magnetic field in the main magnetic field region and the at least one additional magnetic field region.

Specifically, the magnetic field optimization unit 502 calculates the optimized shimming current distribution or the optimized shim distribution for forming the homogenized field in the main magnetic field and the at least one additional magnetic field.

In this embodiment, the magnetic field outputting unit 503 can comprise at the same time a shimming current control unit 5031 and a shim control unit 5032. The shimming current control unit 5031 applies corresponding currents to the shimming coils of different orders according to the optimized shimming current distribution; and the shim control unit 5032 deploys a number of shims in the shim holder according to the optimized shim distribution.

It will be understood by those skilled in the art that the magnetic field outputting unit 503 can also include only a shimming current control unit 5031 or a shim control unit 5032.

It can be seen from the above solutions that the present invention has the following advantages. Firstly, the present invention expands locally a homogenized magnetic field region, being easy to implement and more economical than designing a bigger isotropic homogenized magnetic field. Secondly, the present invention does not need to modify the structure of an existing magnet and to introduce any additional component, thus providing a greater degree of freedom to the design of the magnet. Thirdly, the present invention does not need to modify the local coils to deploy the local homogeneous field, and also does not need to introduce any additional physical structures to maintain the locally homogenized field.

Mentioned above are merely preferred exemplary embodiments of the present invention, which are not intended to limit the present invention; and any modifications, equivalent substitutions, improvements, etc. made within the spirit and principle of the present invention shall be covered in the protective scope of the present invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating an enlarged region of magnetic field homogeneity, comprising:
   in a field-generating apparatus, comprising a first field generator that generates a basic magnetic field in a basic magnetic field region in said field-generating apparatus, and a second field generator, different from said first field generator, that generates at least one additional magnetic field in at least one additional magnetic field region in said field-generating apparatus, with said at least one additional magnetic field being discrete and separately generated from said basic magnetic field;
   in a processor, determining a spatial position and a size of each of said basic magnetic field region and said at least one additional magnetic field region;
   in said processor, automatically executing an optimization calculation on both of said basic magnetic field region and said at least one additional magnetic field region, with said spatial position and said size of each of said basic magnetic field region and said at least one additional magnetic field region entering into said optimization calculation, to produce an optimization result that defines operation or structure of said field-generating apparatus that homogenizes an enlarged magnetic field region in said field-generating apparatus, comprised of said basic magnetic field region and said at least one additional magnetic field region; and
   from said processor, emitting said optimization result as an electronic output in a form usable to physically implement said optimization result in said field-generating apparatus.

2. A method as claimed in claim 1 comprising:
   in said field-generating apparatus, physically implementing said optimization result to generate said enlarged magnetic field region in said field-generating apparatus that is homogenized according to said optimization result.

3. A method as claimed in claim 2 wherein said field-generating apparatus comprises shim coils forming said second field generator, each shim coil being operated with a shimming current, said shim coils collectively generating a shimming field, as said at least one additional field, that interacts in said field-generating apparatus with said enlarged magnetic field, and wherein said method comprises:
   in said processor, calculating said optimization result as an optimized shimming current distribution for the respective shimming currents of the respective shim coils, that homogenizes said enlarged magnetic field in said field-generating apparatus; and
   operating said shim coils in said field-generating apparatus with said shimming current distribution.

4. A method as claimed in claim 3 comprising, in said processor, executing said optimization calculation to produce said optimization result by solving Laplace's equation $\nabla^2 B = 0$ respectively for each of said basic magnetic field region and said at least one additional magnetic field region, wherein B is a magnetic induction intensity of said enlarged magnetic field region comprised of said basic magnetic field region and said at least one additional magnetic field region.

5. A method as claimed in claim 2 wherein said field-generating apparatus comprises a plurality of shims at respective positions in said field-generating apparatus forming said second field generator, said shims each being comprised of material that influences the homogeneity of said enlarged magnetic field region, said method comprising:
   in said processor, calculating said optimization result as an optimized shim position distribution of the respective positions as said shims in said field-generating apparatus; and
   positioning the respective shims in said field-generating apparatus at the respective positions according to said optimized shim distribution.

6. A method as claimed in claim 5 comprising, in said processor, executing said optimization calculation to produce said optimization result by solving Laplace's equation $\nabla^2 B = 0$ respectively for each of said basic magnetic field region and said at least one additional magnetic field region, wherein B is a magnetic induction intensity of said enlarged magnetic field region comprised of said basic magnetic field region and said at least one additional magnetic field region.

7. A method as claimed in claim 1 comprising generating said basic magnetic field and said at least one additional magnetic field in said field-generating apparatus with said basic magnetic field region and said at least one magnetic field region being spatially independent of each other.

8. A method as claimed in claim 1 comprising generating said basic magnetic field and said at least one additional magnetic field in said field-generating apparatus with a portion of said at least one additional magnetic field region, that is less than an entirety of said at least one additional magnetic field region, overlapping said basic magnetic field region.

9. A method as claimed in claim 1 wherein said field-generating apparatus is a magnetic resonance data acquisition unit, said method comprising:
   generating said basic magnetic field and said at least one additional magnetic field in a magnetic resonance data acquisition procedure in order to acquire magnetic resonance data from said enlarged magnetic field region.

10. A magnetic field-generating system for generating an enlarged region of magnetic field homogeneity, comprising:
    a field-generating unit comprising a first field generator that generates a basic magnetic field in a basic magnetic field region in said field-generating unit, and a second field generator, different from said first field generator, that generates at least one additional magnetic field in at least one additional magnetic field region in said field-generating unit, with said at least one additional magnetic field being discrete and separately generated from said basic magnetic field;
    a processor configured to determine a spatial position and a size of each of said basic magnetic field region and said at least one additional magnetic field region;
    said processor being configured to automatically execute an optimization calculation on both of said basic magnetic field region and said at least one additional magnetic field region, with said spatial position and said size of each of said basic magnetic field region and said at least one additional magnetic field region entering into said optimization calculation, to produce an optimization result that defines operation or structure of said field-generating unit that homogenizes an enlarged magnetic field region in said field-generating apparatus, comprised of said basic magnetic field region and said at least one additional magnetic field region; and
    said processor being configured to emit said optimization result as an electronic output in a form usable to physically implement said optimization result in said field-generating unit.

11. A system as claimed in claim 10 comprising:
    shim coils forming said second field generator in said field-generating unit, and a control unit that operates each of said shim coils with a shimming current, to cause said shim coils to collectively generate a shimming field, as said at least one additional field, that interacts in said field-generating apparatus with said enlarged magnetic field;

said processor being configured to calculate, as said optimization result, an optimized shimming current distribution for the respective shimming currents of the respective shim coils, that homogenizes said enlarged magnetic field in said field-generating apparatus; and said control unit being configured to operate said shim coils in said field-generating unit with said shimming current distribution.

12. A system as claimed in claim 11 wherein said processor is configured to execute said optimization calculation to produce said optimization result by solving Laplace's equation $\nabla^2 B=0$ respectively for each of said basic magnetic field region and said at least one additional magnetic field region, wherein B is a magnetic induction intensity of said enlarged magnetic field region comprised of said basic magnetic field region and said at least one additional magnetic field region.

13. A system as claimed in claim 10 comprising:

a plurality of shims at respective positions in said field-generating apparatus, forming said second field generator said shims each being comprised of material that influences the homogeneity of said enlarged magnetic field region;

said processor being configured to calculate said optimization result as an optimized shim position distribution of the respective positions as said shims in said field-generating unit; and said processor being configured to emit said optimization result as an instruction to position the respective shims in said field-generating unit at the respective positions according to said optimized shim distribution.

14. A system as claimed in claim 13 wherein said processor is configured to execute said optimization calculation to produce said optimization result by solving Laplace's equation $\nabla^2 B=0$ respectively for each of said basic magnetic field region and said at least one additional magnetic field region, wherein B is a magnetic induction intensity of said enlarged magnetic field region comprised of said basic magnetic field region and said at least one additional magnetic field region.

15. A system as claimed in claim 10 wherein said field-generating unit generates said basic magnetic field and said at least one additional magnetic field in said field-generating unit with said basic magnetic field region and said at least one magnetic field region being spatially independent of each other.

16. A system as claimed in claim 10 wherein said field-generating unit generates said basic magnetic field and said at least one additional magnetic field in said field-generating apparatus with a portion of said at least one additional magnetic field region, that is less than an entirety of said at least one additional magnetic field region, overlapping said basic magnetic field region.

17. A system as claimed in claim 10 wherein said field-generating apparatus is a magnetic resonance data acquisition unit that generates said basic magnetic field and said at least one additional magnetic field in a magnetic resonance data acquisition procedure in order to acquire magnetic resonance data from said enlarged magnetic field region.

* * * * *